United States Patent [19]

Kasahara

[11] Patent Number: 5,136,345
[45] Date of Patent: Aug. 4, 1992

[54] SEMICONDUCTOR LAYER COMPRISING CYCLICALLY STACKED NARROW, INTERMEDIATE, AND WIDE BAND GAP SEMICONDUCTOR FILMS

[75] Inventor: Kenichi Kasahara, Tokyo, Japan

[73] Assignee: NEC Corporation, Tokyo, Japan

[21] Appl. No.: 632,701

[22] Filed: Dec. 21, 1990

[30] Foreign Application Priority Data

Dec. 21, 1989 [JP] Japan ................................. 1-334337
Apr. 16, 1990 [JP] Japan ................................. 2-99661

[51] Int. Cl.$^5$ ..................... H01L 49/02; H01L 33/00; H01L 29/205; H01S 3/08
[52] U.S. Cl. ......................................... 357/4; 357/16; 357/17; 372/45; 372/49; 372/99; 359/580
[58] Field of Search ................... 350/164; 372/49, 99, 372/45; 357/16, 4, 17

[56] References Cited

U.S. PATENT DOCUMENTS

4,949,350  8/1990  Jewell et al. ........................ 357/17

Primary Examiner—Jerome Jackson, Jr.
Attorney, Agent, or Firm—Sughrue, Mion, Zinn, Macpeak & Seas

[57] ABSTRACT

A semiconductor layer for reflecting an optical beam, the semiconductor layer includes a plurality of film pairs of narrow and wide band gap semiconductor films (21, 22) having a refractive index difference and narrower and wider band gaps, an intermediate semiconductor film (31) is interposed between the narrow and the wide band gap semiconductor films of each film pair and is made to have an intermediate film band gap which is varied so as to be equal to the narrower and the wider band gaps at its interfaces contiguous to the narrow and the wide band gap semiconductor films. The narrow band gap semiconductor film and a portion adjacent thereto in the intermediate semiconductor film are called a first composite layer and given a first total thickness which is approximately equal to a quarter of a first wavelength had by the optical beam in the first composite layer. The wide band gap semiconductor film and a remaining portion adjacent thereto in the intermediate semiconductor film are called a second composite layer and given a second total thickness which is approximately equal to a quarter of a second wavelength had by the optical beam in the second composite layer. Preferably, the intermediate semiconductor film should have a film thickness which is substantially equal to a width which a potential barrier has perpendicularly of the film pairs if the intermediate semiconductor film were absent. More preferably, absorption of the optical beam in the narrow and the wide band gap semiconductor films is taken into account on determining their thicknesses.

10 Claims, 5 Drawing Sheets

SEMICONDUCTOR LAYER COMPRISING CYCLICALLY STACKED NARROW, INTERMEDIATE, AND WIDE BAND GAP SEMICONDUCTOR FILMS

BACKGROUND OF THE INVENTION

This invention relates to a semiconductor layer which has a multilayer structure of alternatingly stacked narrow and wide band gap semiconductor films having a refractive index difference and is for use typically in a surface emitting laser diode.

Surface emitting laser diodes are already known. An example is described in a letter contributed by Y. H. Lee and five others to the Electronic Letters, Volume 25, No. 20 ( 28th September, 1989), pages 1377 and 1378, under the title of "Room-temperature Continuous-wave Vertical-cavity Single-quantum-well Microlaser Diodes". Such a surface emitting laser diode comprises two semiconductor layers of the type described.

In the manner which will later be described more in detail, a conventional semiconductor layer comprises an alternate or cyclic stack of narrow and wide band gap semiconductor films having a refractive index difference and narrower and wider band gaps. The semiconductor layer has a multilayer structure of a plurality of film pairs in this manner and is for reflecting a laser or optical beam of a nominal wavelength. Typically, the narrow and the wide band gap semiconductor films have higher and lower refractive indices of the refractive index difference and may alternatively be called high and low refractive semiconductor films. When only one of the film pairs is taken into consideration, it is possible to refer to the narrow and the wide band gap semiconductor films as first and second semiconductor films.

The surface emitting laser diode of the Lee et al letter is excellently operable. It has, however, been found by the present applicant that the surface emitting laser diode has a high build up voltage at which an electric current begins to flow through the laser diode. This is a serious problem on actually using such surface emitting laser diodes. Furthermore, the laser diode has a high differential resistance value. The high build up voltage and the high differential resistance value are additional serious problems on manufacturing the surface emitting laser diode in an integrated circuit. These problems are unavoidably given rise to by the semiconductor layer which is indispensable in a surface emitting laser diode.

SUMMARY OF THE INVENTION

It is therefore an object of the present invention to provide a semiconductor layer which can be used in a surface emitting laser diode without unduly raising a build up voltage.

It is another object of this invention to provide a semiconductor layer of the type described, which can make a surface emitting laser diode have a low differential resistance value.

It is still another object of this invention to provide a semiconductor layer of the type described, which has as high a reflectivity as a conventional semiconductor layer and can be used in a semiconductor reflector.

Other objects of this invention will become clear as the description proceeds.

On describing the gist of this invention, it is possible to understand that a semiconductor layer comprises as a multilayer structure of a plurality of film pairs an alternate stack of narrow and wide band gap semiconductor films having a refractive index difference and a narrower band gap and a wider band gap and is for reflecting an optical beam of a nominal wavelength.

According to this invention, the above-understood semiconductor layer is characterized by an intermediate semiconductor film interposed between the narrow and the wide band gap semiconductor films of each of the film pairs. The intermediate semiconductor film has an intermediate film band gap varying between the narrower and the wider band gaps. The narrow band gap semiconductor film of the above-mentioned each of the film pairs and a portion adjacent thereto in the intermediate semiconductor film serve as a first composite layer and have a first total thickness which is approximately equal to a quarter of a first wavelength had by the optical beam in the first composite layer. The wide band gap semiconductor film of the above-mentioned each of the film pairs and a remaining portion adjacent thereto in the intermediate semiconductor film serve as a second composite layer and have a second total thickness which is approximately equal to a quarter of a second wavelength had by the optical beam in the second composite layer.

DESCRIPTION OF THE PREFERRED EMBODIMENTS

Figure 1:
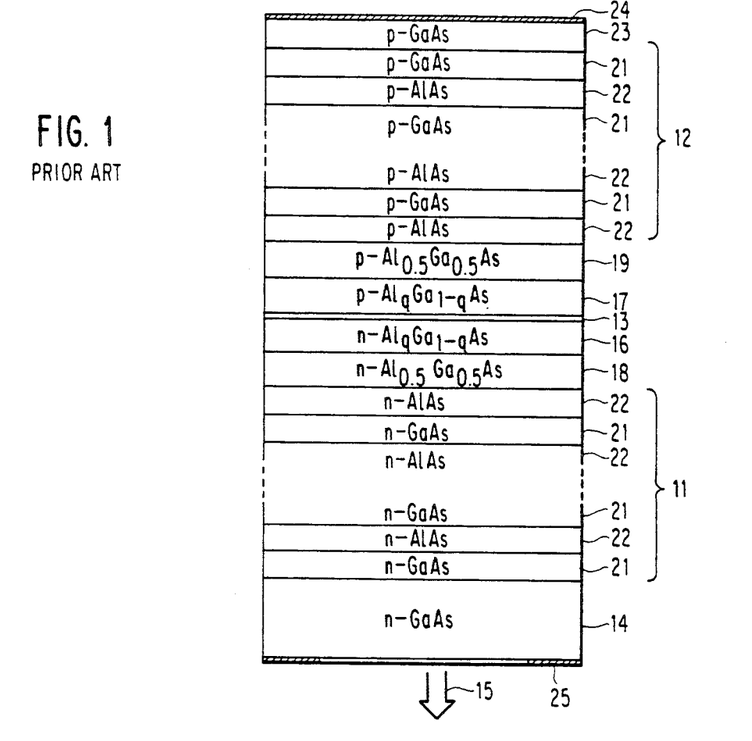
FIG. 1 is a schematic vertical sectional view of a surface emitting laser diode comprising two conventional semiconductor layers.

Referring to FIG. 1, a conventional semiconductor layer will be described at first in order to facilitate an understanding of the present invention. In the manner which will be described in the following, two conventional semiconductor layers are used in a surface emitting laser diode which is disclosed in the Lee et al letter cited heretobefore. It should be noted that the following contains more detail in some respects than the disclosure of the Lee et al letter. This is in order to enable one skilled in the art to readily make a semiconductor layer according to this invention and a surface emitting laser diode comprising the last-mentioned semiconductor layers.

In general, first and second semiconductor layers 11 and 12 are used in a surface emitting laser diode on both sides of an active layer 13. When the laser diode is lased, the active layer 13 emits perperdicularly thereof a laser beam which may be called an optical beam and has a nominal wavelength in vacuum. The first and the second semiconductor layers 11 and 12 are for repeatedly reflecting the laser beam to provide a vertical cavity orthogonally of the active layer 13 for the laser beam of the nominal wavelength.

The first semiconductor layer 11 is formed on a semiconductor substrate 14. It will be assumed that the semiconductor substrate 14 is made of n-type gallium arsenide (n-GaAs) and that the active layer 13 is made of non-doped $In_{0.2}Ga_{0.8}As$ to be about 100 Å thick. The nominal wavelength is about 9800 Å. The laser beam is led outwardly of the laser diode through the first semiconductor layer 11 and the semiconductor substrate 14, namely, downwardly of the figure in the manner symbolically indicated by a double-line arrow 15.

The active layer 13 is bounded by lower and upper adjacent semiconductor films 16 and 17. Lower and upper remote semiconductor films 18 and 19 are formed between the lower adjacent semiconductor film 16 and the first semiconductor layer 11 and between the upper adjacent semiconductor film 17 and the second semiconductor layer 12. The lower and the upper remote semiconductor films 18 and 19 are made of $n-Al_{0.5}Ga_{0.5}As$ and $p-Al_{0.5}Ga_{0.5}As$. The lower and the upper adjacent semiconductor films 16 and 17 are made of $n-Al_qGa_{1-q}As$ and $p-Al_qGa_{1-q}As$, where a first variable q is parabolically varied so as to be equal to 0.2 at an interface contiguous to the active layer 13 and equal to 0.5 at another interface contiguous to the remote semiconductor films 18 or 19 and so as to have a vertex of a parabola substantially at the last-mentioned interface.

The active layer 13 and the adjacent and the remote semiconductor films 16 to 19 have a total thickness of a full wavelength. It should be noted throughout this specification in connection with such a film thickness that the wavelength is what is had by the laser or the optical beam in the medium of a film under consideration.

Each of the first and the second semiconductor layers 11 and 12 has a multilayer structure of a plurality of film pairs. A little more in detail, the semiconductor layer 11 or 12 comprises an alternate or cyclic stack of narrow band gap semiconductor films 21 having a narrower band gap and wide band gap semiconductor films 22 having a wider band gap. The narrow and the wide band gap semiconductor films 21 and 22 should have a refractive index difference.

Typically, the narrow band gap semiconductor films 21 have a higher refractive index and the wide band gap semiconductor films 22, a lower refractive index. The higher and the lower refractive indices have the refractive index difference. The narrow and the wide band gap semiconductor films 21 and 22 may therefore be referred to alternatively as high and low refractive semiconductor films. When only one of the film pairs is taken into account, it is possible to refer to the narrow and the wide band gap semiconductor films 21 and 22 either as first and second semiconductor films or more simply as first and second films.

The first and the second semiconductor layers 11 and 12 are n-type and p-type semiconductor layers. In the example being illustrated, the first and the second films 21 and 22 are made of n-type gallium arsenide and n-type aluminium arsenide (n-AlAs) in the first semiconductor layer 11 and is made of p-type gallium arsenide (p-GaAs) and p-type aluminum arsenide (p-AlAs) in the second semiconductor layer 12 although the first and the second films are designated by like reference numerals irrespective of their conductivity types.

The first semiconductor layer 11 includes one of the narrow band gap semiconductor films 21 in direct contact with the semiconductor substrate 14 and one of the wide band gap semiconductor films 22 in direct contact with the lower remote semiconductor film 18. The second semiconductor layer 12 includes one of the wide band gap semiconductor films 22 in direct contact with the upper remote semiconductor film 19 and one of the narrow band gap semiconductor films 21 most remote from the upper remote semiconductor film 19.

In the conventional semiconductor layer 11 or 12, each of the first and the second films 21 and 22 has a quarter-wavelength thickness. In other words, the first and the second films 21 and 22 are 680 Å and 820 Å thick in the illustrated example.

A phase compensating semiconductor film 23 is formed on the second semiconductor layer 12. A p-type electrode 24 is formed on the phase compensating semiconductor film 23 with a delta-doped semiconductor film (not shown) of a very thin thickness interposed. The phase compensating semiconductor film 23 is for compensating for a phase shift which occurs when the laser beam is reflected by the p-type electrode 24, having passed through the second semiconductor layer 12, back towards the second semiconductor layer 12. The delta-doped semiconductor film is for insuring ohmic contact of the p-type electrode 24 to the phase compensating semiconductor film 23. Being very thin, the delta-doped semiconductor film subjects only to a negligible phase shift the laser beam reciprocating therethrough.

In the example being illustrated, the phase compensating semiconductor film 23 is made of p-type gallium arsenide. The delta-doped semiconductor film is made of delta-doped gallium arsenide. The p-type electrode 24 is made of gold in order to assist reflection of the laser beam.

The narrow and the wide band gap semiconductor films 21, 22, 21, ..., 21, 22, and 21 of the first semiconductor layer 11, the lower remote and adjacent semiconductor films 18 and 16, the active layer 13, the upper adjacent and remote semiconductor films 17 and 19, the wide and the narrow band gap semiconductor films 22, 21, 22, ..., 21, 22, and 21 of the second semiconductor layer 12, the phase compensating semiconductor film 23, and the delta-doped semiconductor film are successively grown by molecular beam epitaxy on the semiconductor substrate 14. After an exposed surface of the semiconductor substrate 14 is polished to a polished surface, an n-type electrode 25 is formed on the polished surface with a window for the laser beam formed to leave the polished surface uncovered. It should be noted that the semiconductor films 13, 16 to 19, and 21 and 22 and the semiconductor substrate 14 are depicted in FIG. 1 without hatches although FIG. 1 is a schematic vertical sectional view of a surface emitting laser diode according to Lee et al. The laser diode is illustrated with its vertical dimensions much exaggerated.

In order to put the surface emitting laser diode into operation with a small threshold current, the first and the second semiconductor layers 11 and 12 must have a high reflectivity for the laser beam of the nominal wavelength. Therefore, the first semiconductor layer 11 comprises about twenty film pairs and the second semiconductor layer 12, about ten film pairs, where each film pair comprises the first and the second films 21 and 22. In addition, each of the first and the second films 21 and 22 is given a quarter wavelength thickness in the conventional semiconductor layer 11 or 12. A plurality of film pairs are used because the higher and the lower refractive indices are not much different. When the laser diode of the Lee et al letter is cylindrically shaped and has a diameter of 2 microns, the threshold current is about 1 mA.

Figure 2:
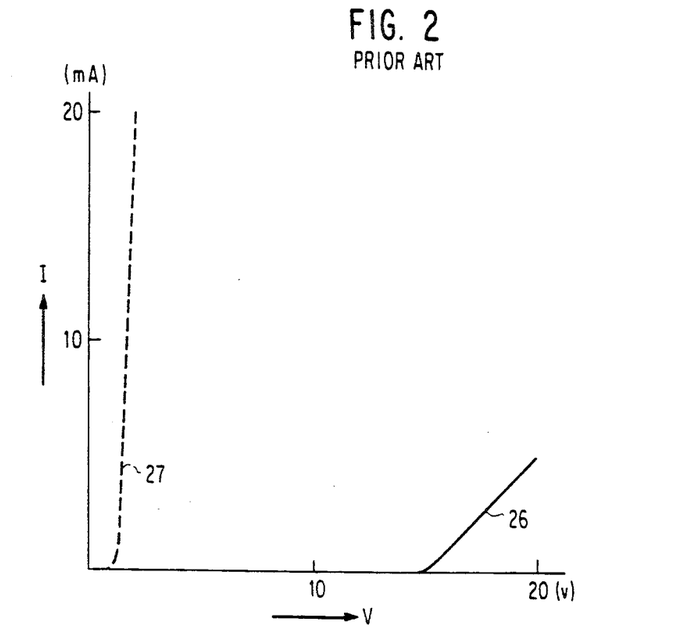
FIG. 2 shows a current versus voltage characteristic of the surface emitting laser diode illustrated in FIG. 1.

Turning to FIG. 2, the conventional semiconductor layer 11 or 12 unavoidably makes the surface emitting laser diode have a high build up voltage V at which an electric current I begins to flow through the laser diode. In the manner exemplified by a solid-line curve 26, the build up voltage is 15 to 20 V when the laser diode is 2 to 3 microns in diameter. This high build up voltage is about ten times as high as a build up voltage which is indicated by a dashed-line curve 27 for traditional stripe-type laser diode that is not the surface emitting laser diode of the type being illustrated. The high build up voltage gives rise to a serious problem on actually using the surface emitting laser diodes. Furthermore, the surface emitting laser diode has a high differential resistance value. The high build up voltage and the high differential resistance value result in necessity of a high voltage on causing a peredetermined electric current, such as the threshold current, to flow through the laser diode. This results in an unduly great power consumption and is another serious problem on manufacturing a surface emitting laser diode in an integrated circuit.

Figure 3A:
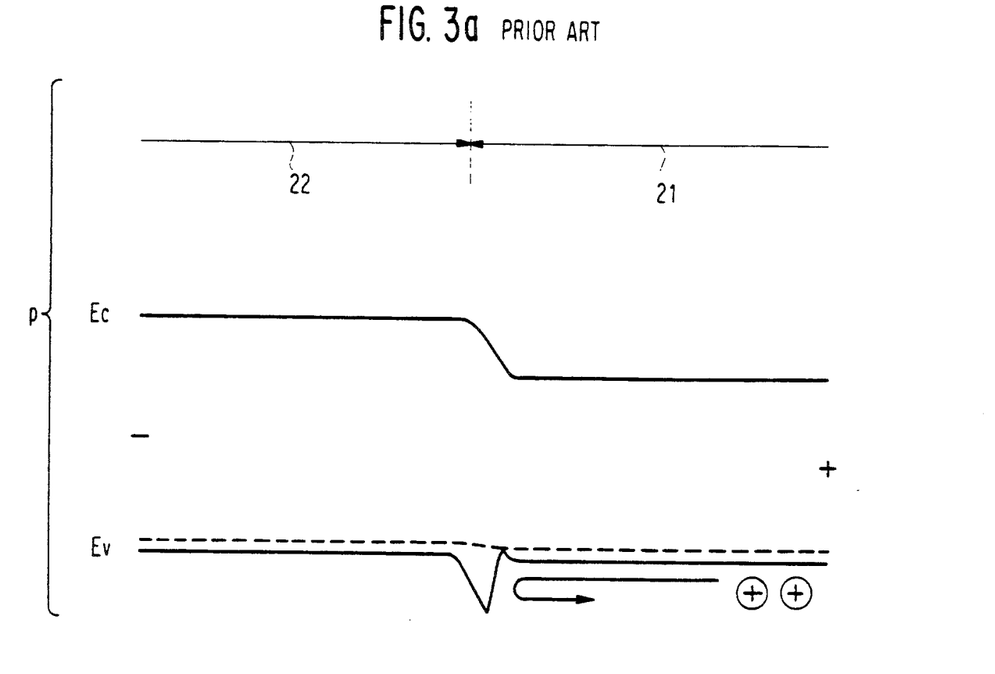
FIGS. 3a, 3b schematically show band diagrams in connection with the conventional semiconductor layers depicted in FIG. 1.
Figure 3B:
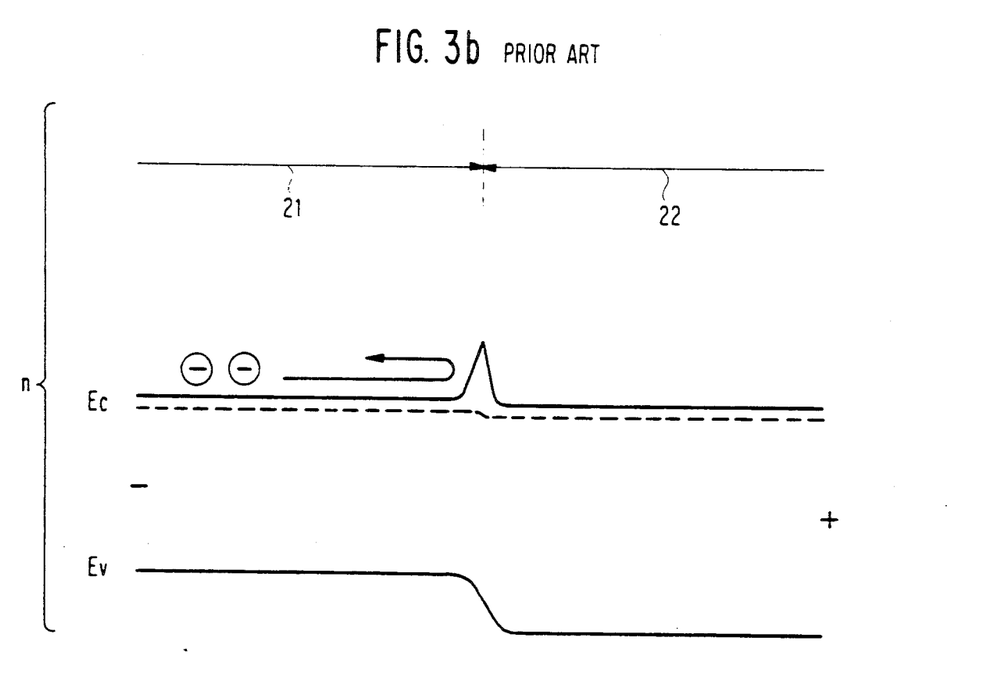

Further turning to FIG. 3, energy band diagrams were studied by the present inventor with respect to the conventional semiconductor layers 11 and 12 which are used in the surface emitting laser diode according to Lee et al. The band diagrams are depicted in connection with an adjacency of an interface between the first and the second films 21 and 22, namely, the narrow and the wide band gap semiconductor films 21 and 22. Upper and lower halves of the figure show first and second cases where the adjacency is in the second or the p-type and the first or the n-type semiconductor layers 12 and 11. It is assumed that a voltage is applied across the surface emitting laser diode with a higher voltage given to the second film 22 in the second semiconductor layer 12 and to the first film 21 in the first semiconductor layer 11 in the manner indicated by plus and minus signs.

In each of the first and the second cases, energy of the conduction band is denoted by Ec and energy of the valence band, by Ev. In the first case, the Fermi level is slightly above the valence band. In the second case, the Fermi level is slightly below the conduction band. In each case, the Fermi level is depicted by a dashed line. Holes are indicated by encircled plus signs and electrons, by encircled minus signs.

In the p-type semiconductor layer 12, a potential barrier appears near the interface between the first and the second films 21 and 22 in the manner depicted below the Fermi level. The potential barrier impedes a smooth flow of the holes through the p-type semiconductor layer 12 along the valence band in the manner symbolized by a U-turning line.

In the n-type semiconductor layer 11, another potential barrier appears near the interface between the first and the second films 21 and 22 in the manner depicted above the Fermi level. The potential barrier impedes a smooth flow of the electrons through the n-type semiconductor layer 11 along the conduction band in the manner symbolized by another U-turning line.

It has been confirmed by the present inventor that such a potential barrier appears mainly in the first film 21. More particularly, the potential barrier is inevitably formed by a discontinuity between the narrower and the wider band gaps against charged elementary particles, namely, the holes or the electrons, which are caused to flow through the interface. The potential barrier has a barrier width or thickness perpendicularly of the interface.

When the first and the second films 21 and 22 are made of gallium arsenide and aluminium arsenide, the barrier width is about 50 Å. More in detail, the potential barrier consists of a main and a subordinate barrier portion in the first and the second films 21 and 22. The main barrier portion has a first portion width of about 40 Å and the subordinate barrier portion, a second barrier width of about 10 Å. Such potential barriers raise the build up voltage and the differential resistance value. FIG. 3 will again be referred to later on describing a modification of the semiconductor layer 11 or 12 being illustrated.

Figure 4:
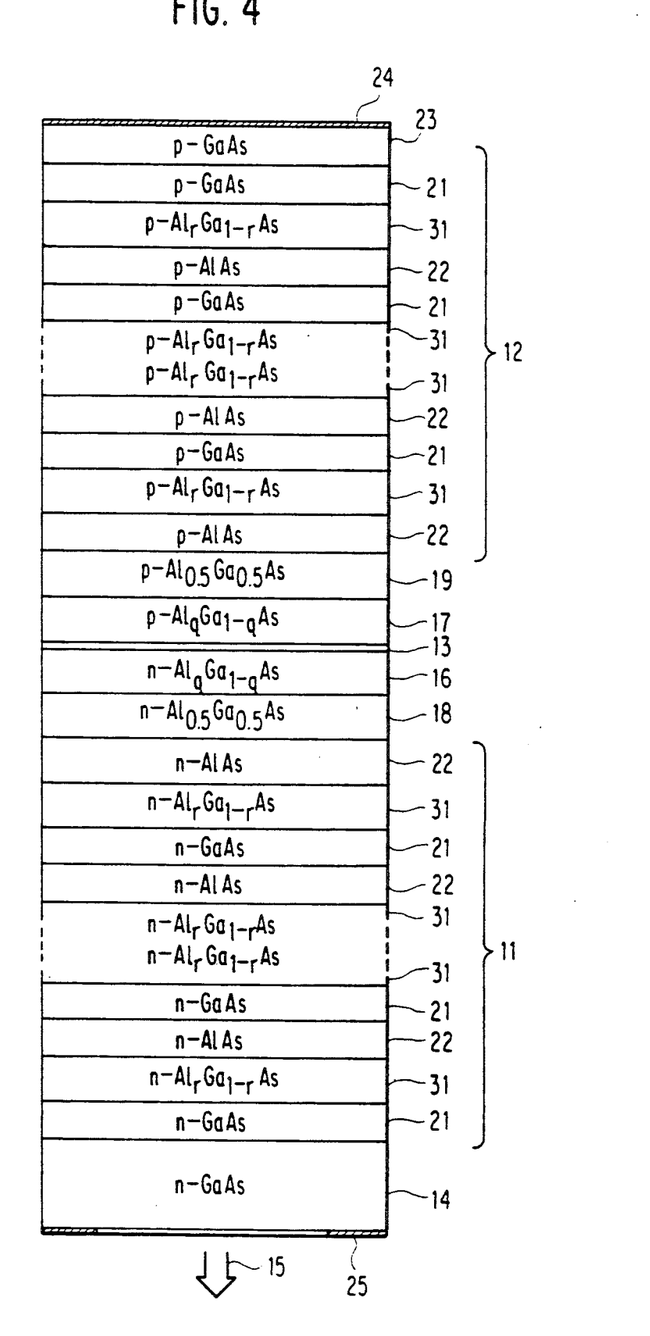
FIG. 4 is a schematic vertical sectional view of a surface emitting laser diode which comprises two semiconductor layers according to a first embodiment of the instant invention.

Referring now to FIG. 4, the description will proceed to a surface emitting laser diode which comprises semiconductor layers according to a first embodiment of this invention. Similar parts are designated by like reference numerals and are similarly operable. It will be presumed for brevity of the description that the parts are made of materials or compounds exemplified with reference to FIG. 1. The p-type electrode 25 is made of AuGe-Ni/Au. Facts should be clearly noted that the first or the n-type and the second or the p-type semiconductor layers are designated in FIG. 4 by the reference numerals 11 and 12 although these semiconductor layers are somewhat different in structure from those described in conjunction with FIG. 1 in the manner which will presently be described.

In surface emitting laser diodes which were actually manufactured according to the example being illustrated, the active layer 13 was 80 Å thick. The nominal wavelength was about 9800 Å. The first or the n-type and the second or the p-type semiconductor layers 11 and 12 were doped to a concentration of $2 \times 10^{18}$ cm$^{-3}$. The delta-doped semiconductor film was doped by bellirium to a concentration of $2 \times 10^{19}$ cm$^{-3}$. The first semiconductor layer 11 comprised twenty film pairs of the narrow and the wide band gap semiconductor films 21 and 22. The second semiconductor layer 12 comprised ten film pairs of the narrow and the wide band gap semiconductor films 21 and 22.

In each pair of the narrow band gap semiconductor film or the first film 21 and the wide band gap semiconductor film or the second film 22, an intermediate semiconductor film 31 is interposed between the first and the second films 21 and 22. Such intermediate semiconductor films 31 are given n-type and p-type conductivities in the first and the second semiconductor layers 11 and 12. In the example being illustrated, each intermediate semiconductor film 31 is made of Al$_r$Ga$_{1-r}$As, where where a second variable r is continuously varied between the first and the second films 21 and 22 so as to be equal to zero and to unity at first and second intermediate film surfaces which are contiguous to the first and the second films 21 and 22.

In this manner, each intermediate semiconductor film 31 is made to have an intermediate film refractive index between the higher and the lower refractive indices and an intermediate film band gap between the narrower and the wider band gaps. Between the first and the second intermediate film surfaces, the intermediate film band gap is continuously varied so as to be equal to the narrower and the wider band gaps at the first and the second intermediate film surfaces. It may be that the intermediate film band gap should be varied near the first and the second intermediate film surfaces so as to have a slope which continuously varies. It has, however, been confirmed that variation in the intermediate filmband gap is not critical insofar as the variation is continuous.

Each intermediate semiconductor film 31 has an intermediate film thickness which is preferably substantially equal to the barrier width. More specifically, first and second film portions will be considered adjacent to the first and the second intermediate film surfaces of each intermediate semiconductor film 31. Preferably, the first and the second film portions should substantially be the first and the second portion widths thick.

The first film 21 and the first film portion may be referred to as a first composite layer and the second film 22 and the second film portion, as a second composite layer. The first composite layer should have a first total thickness which is substantially equal to a quarter of a first wavelength had by the laser beam in the first composite layer. The second composite layer should have a second total thickness which is substantially equal to a quarter of a second wavelength had by the laser beam in the second composite layer.

When the first and the second films 21 and 22 and the intermediate semiconductor film 31 are made of materials exemplified above, the intermediate film thickness is about 50 Å. The first and the second film portions are about 40 Å and about 10 Å thick. The first film 21 has a first film thickness which is about 655 Å. The second film 22 has a second film thickness which is about 795 Å. Inasmuch as each intermediate semiconductor film 31 is very thin, the intermediate semiconductor films 31 do not adversely affect reflection of the laser beam at and in the semiconductor layer 11 or 12.

It will now be surmised more in general that the first, the second, and the intermediate film thicknesses are $D(1)$, $D(2)$, and $D(3)$, that the first film portion has a first portion thickness $D(p)$, that the higher and the lower refractive indices are $n(1)$ and $n(2)$, and that the intermediate film refractive index varies according to $n(x)$, where x represents a distance which is measured from the first intermediate film surface towards the second intermediate film surface. Under the circumstances, first and second equations should hold in connection with the first and the second composite layers as follows:

$$\left. \begin{array}{l} n(1)D(1) + \int_{0}^{D(p)} n(x)dx = \lambda_0/4 \\ \text{and} \\ n(2)D(2) + \int_{D(p)}^{D(3)} n(x)dx = \lambda_0/4, \end{array} \right\} \quad (1)$$

where $\lambda_0$ represents the nominal wavelength.

Figure 5A:
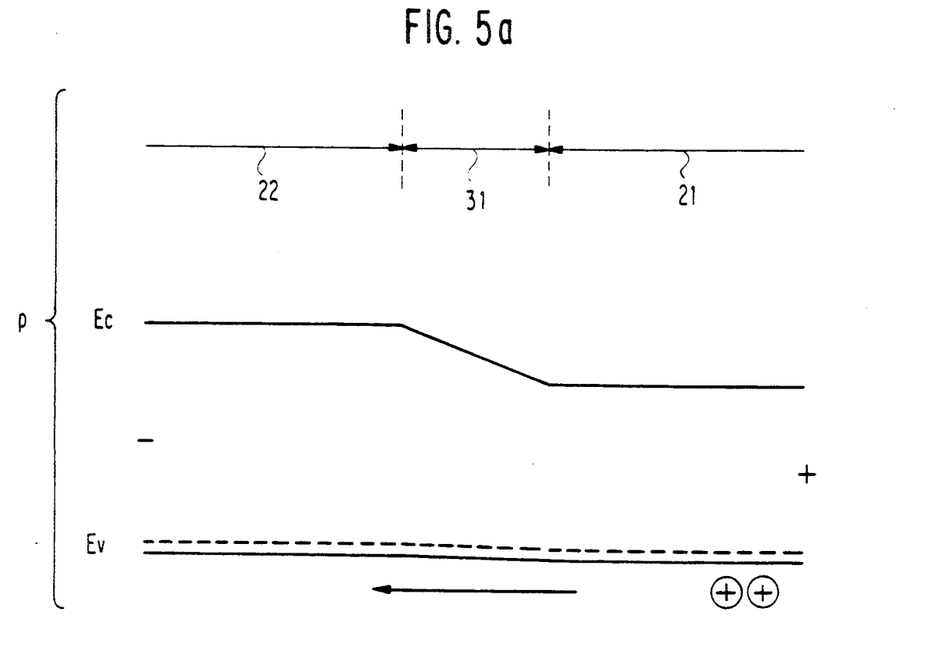
FIGS. 5a, 5b schematically show band diagrams in connection with the semiconductor layers illustrated in FIG. 4.
Figure 5B:
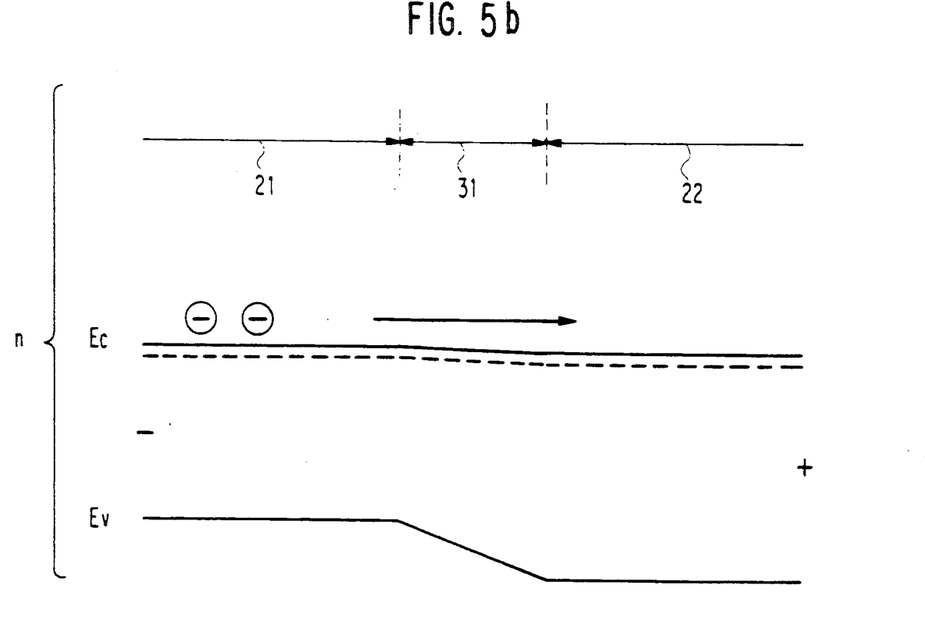

Turning to FIG. 5, energy band diagrams are schematically illustrated in connection with a firm pair portion of each of the film pairs. Upper and lower halves of the figure show the band diagrams for first and second cases where the film pair portions are in the second or the p-type and the first or the n-type semiconductor layers 12 and 11. Each film pair portion consists of the intermediate semoconductor film 31 and adjacent portions of the first and the second films 21 and 22, namely, of the narrow and the wide band gap semiconductor films 21 and 22. As in FIG. 3, it is assumed that a voltage is applied across the surface emitting laser diode being illustrated with a higher voltage given to the second film 22 in the second semiconductor layer 12 and to the first film 21 in the first semiconductor layer 11 in the manner indicated by plus and minus signs.

When FIG. 5 is compared with FIG. 3, it is seen that the potential barrier hardly appears in the film pair portion of each of the first and the second semiconductor layers 11 and 12. The holes and the electrons therefore smoothly flow through the second and the first semiconductor layers 12 and 11 in the manner symbolically indicated by horizontal arrows. Consequently, the surface emitting laser diode has a low build up voltage and a low differential resistance value. Each actually manufactured laser diode of a cylindrical shape of a diameter of 2 microns had a build up voltage which was less than 2 V in marked contrast to the laser diode according to the Lee et al letter. The actually manufactured laser diode had a threshold current of about 1 mA like the laser diode according to Lee et al. The threshold current was 2.5 mA when the actually manufactured laser diode had a cross-sectional area of 10 square microns.

Figure 6:
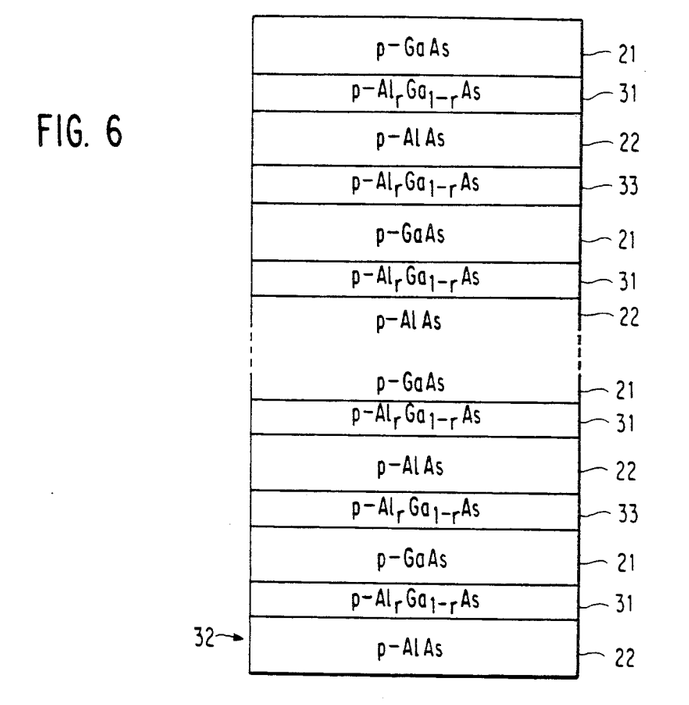
FIG. 6 is a schematic vertical sectional view of a semiconductor layer according to a modification of one of the two semiconductor layers depicted in FIG. 4.

Referring to FIG. 6, a p-type semiconductor layer 32 comprises additional semiconductor films 33 according to a modification of the second or the p-type semiconductor layer 12 described in conjunction with FIG. 4. Atention will be directed to two of the film pairs which will be called first and second film pairs. In FIGS. 4 and 6, the first and the second film pairs are upper and lower film pairs. In FIG. 4, these film pairs are contiguous on both sides of a film pair interface. In FIG. 6, each additional semiconductor film 33 is formed along such a film pair interface.

Merely for convenience of the description, the narrow band gap semiconductor film 21 will be referred to as a first band gap semiconductor film in the first film pair. The wide band gap semiconductor film 22 will be called a second band gap semiconductor film in the second film pair. The first and the second band gap semiconductor films 21 and 22 are adjacent to each other in the two film pairs. The additional semiconductor film 33 is interposed between the first and the second band gap semiconductor films 21 and 22.

Like each intermediate semiconductor film 31, each additional semiconductor film 33 has an additional film refractive index between the higher and the lower refractive indices and an additional film band gap between the narrower and the wider band gaps. The additional film band gap is continuously varied between the narrower and the wider band gaps so as to be equal to the narrower and the wider band gaps at first and second additional film surfaces which the additional semiconductor film 33 has contiguous to the first and the second band gap semiconductor films 21 and 22.

The first band gap semiconductor film 21 and a first film portion adjacent thereto in the additional semiconductor film 33 has the first total thickness. The second band gap semiconductor film 22 and a second film portion adjacent thereto in the additional semiconductor film 33 has the second total thickness. Stated differently, the first band gap semiconductor film 21 and a portion adjacent thereto in the additional semiconductor film 33 serves as a third composite layer and have a third total thickness which is substantially equal to a quarter of a third wavelength had by the laser beam in the third composite layer. The second band gap semiconductor film 22 and a remaining portion adjacent thereto in the additional semiconductor film 33 serves as a fourth composite layer and have a fourth total thickness which is substantially equal to a quarter of a fourth wavelength had by the laser beam in the fourth composite layer.

In the example being illustrated, the additional semiconductor film 33 is made of $Al_rGa_{1-r}As$ given the p-type conductivity like the intermediate semiconductor film 31 in the second or the p-type semiconductor layer 12, where the second variable r is continuously varied so as to be equal to zero and unity at the first and the second additional film surfaces. Variation in the additional film band gap and consequently that in the second variable is not critical insofar as the variation is continuous. It is preferred to use such additional semiconductor films also in the first or the n-type semiconductor layer 11 described in connection with FIG. 4 with the last-mentioned additional semiconductor films given the n-type conductivity. It is now understood that "semiconductor layer comprising cyclically stacked narrow, intermediate, and wide band gap semiconductor films" would be a shortest possible expression that is descriptive of a semiconductor layer according to this invention.

Referring again to FIG. 3, the first film 21 is in the upper half of the figure the first band gap semiconductor film 21 described above. The second band gap semiconductor film 22 is therefore contiguous rightwardly of the first film 21 and is given an electric potential which is higher than that given to the first film 21 under consideration. A different potential barrier therefore appears at the film pair interface. This potential barrier is mainly in the first film 21.

In the lower half, the second film 22 is the second band gap semiconductor film 22. The first band gap semiconductor film 21 is consequently contiguous rightwardly of the second film 22 and is given an electric potential which is higher than that given to the second film 22. Another different potential barrier appears at the film pair interface. This potential barrier is mainly in the first band gap semiconductor film 21.

The afore-discussed potential barrier will now be called a primary potential barrier. When the voltage is rendered high across the surface emitting laser diode, the primary potential barrier has a primary depth or height which does not appreciably vary. In marked contrast, it has astonishingly been found that such a different potential barrier has a secondary depth or height which decreases when the voltage is raised. The intermediate semiconductor films 31 are therefore very important in reducing the build up voltage and the differential resistance value. In contrast, the additional semiconductor films 33 are not so important as the intermediate semiconductor films 31. It is now readily possible to select each first film pair on forming the intermediate semiconductor film 31.

Each different potential barrier has a barrier width and first and second portion widths which are substantially equal to the barrier width and the first and the second portion widths of the primary potential barrier although the primary and the different potential barriers may have different depths or heights. Preferably, the additional semiconductor film 33 should have an additional film thickness which is substantially equal to the barrier width. The first film thickness should be equal to the quarter wavelength thickness minus twice the first portion width. The second film thickness should be the quarter wavelength thickness less twice the second portion width. When the parts are made of the materials exemplified before, the additional film thickness is about 50 Å. The first and the second film thicknesses are about 615 Å and about 785 Å.

Figure 7:
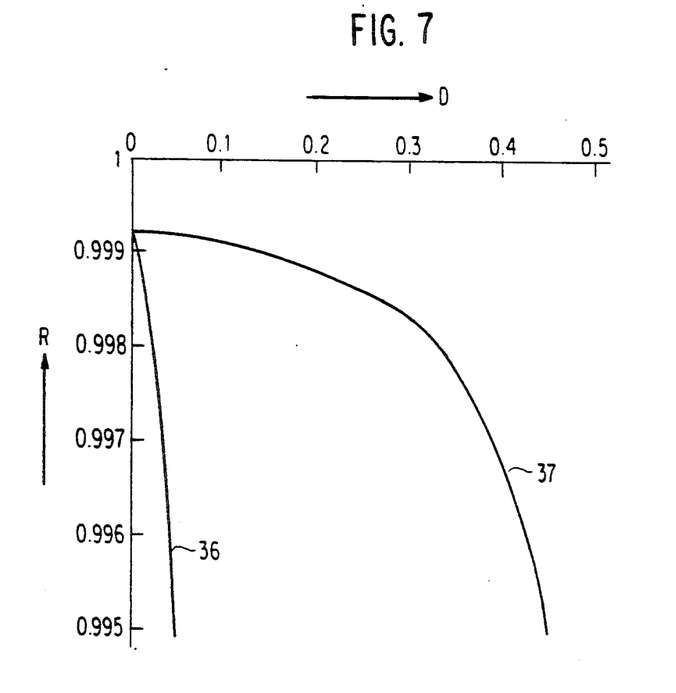
FIG. 7 shows reflectivities versus a deviation from a quanter wavelength thickness of each semiconductor film which is used in a semiconductor layer according to a second embodiment of this invention.

Referring to FIG. 7, each of the first or the n-type and the second or the p-type semiconductor layers 11 and 12 has a reflectivity R dependent on a deviation D from the quarter wavelength thickness of the first and the second total thicknesses. On defining the deviation, the first and the second film thicknesses D(1) and D(2) will afresh be called first and second differences. When the additional semiconductor films 33 are not formed in each semiconductor layer 11 or 12, the first difference is a difference between the first total thickness and the first portion width of the potential barrier and the second difference, another difference between the second total thickness and the second portion width. It will be assumed that the first or the narrow band gap semiconductor film 21 and the second or the wide band gap semiconductor film 22 are rendered first and second adjusting thicknesses d(1) and d(2) thicker to have first and second adjusted thicknesses. The deviation is defined by d(1)/D(1) or d(2)/D(2). When each semiconductor layer 11 or 12 includes the additional semiconductor films 33, the first and the second differences should accordingly be modified.

The reflectivity R was calculated for a nominal wavelength of 9800 Å and with respect to a semiconductor layer which comprises twenty pairs of gallium arsenide and aluminium arsenide films. It will readily be understood that the reflectivity considerably decreases when both the first and the second adjusting thicknesses are either positive or negative. In fact, the reflectivity sharply decreases in the manner illustrated by a first curve 36. In marked contrast, it has unexpectedly been found that the reflectivity does not decrease so much when only one of the first and the second adjusting thicknesses is negative. In fact, the reflectivity decreases from 0.99924 only to 0.99916 when the deviation D is varied from zero up to 0.1 in the manner exemplified by a second curve 37.

Referring again to FIG. 4, each gallium arsenide film 21 gives a greater absorption loss than each aluminium arsenide film 22 to the laser beam passing therethrough. In a semiconductor layer according to a second embodiment of this invention, the first adjusted thickness is rendered equal to about 585 Å and the second adjusted thickness, equal to about 875 Å. Consequently, the first adjusting thickness is equal to about 70 Å and the second adjusting thickness, equal to about 80 Å. Surface emitting laser diodes were actually manufactured in this manner. It has been confirmed that the laser diodes were operable with a smaller threshold current.

More in general, the first and the second adjusted thicknesses are determined as follows. When the first film 21 absorbs the laser beam more strongly than the second film 22, the first adjusted thickness is substantially equal to a three-term sum of the first total thickness minus the first portion thickness of the primary potential barrier minus the first adjusting thickness. The second adjusted thickness is substantially equal to another three-term sum of the second total thickness minus the second portion width plus the second adjusting thickness. When the first film 21 less strongly absorbs the laser beam than the second film 22, the first adjusted thickness is substantially equal to the first total thickness minus the first portion width plus the first adjusting thickness. The second adjusted thickness is substantially equal to the second total thickness minus the second portion width minus the second adjusting thickness. In either event, the first and the second adjusting thicknesses and the first and the second differences should be determined according to an equation:

$$-n(1)d(1)/\left[n(1)D(1) + \int_0^{D(p)} n(x)dx\right]$$
$$= n(2)d(2)/\left[n(2)D(2) + \int_{D(p)}^{D(3)} n(x)dx\right], \quad (2)$$

where various symbols are not different from those used in Equation (1). Equation (2) holds irrespective of one of the narrow and the wide band gap semiconductor films 21 and 22 that absorbs the optical beam either more or less strongly than the other.

Referring again to FIG. 6, each p-type gallium arsenide film 21 is about 615 Å thick and each p-type aluminium arsenide film 22, about 955 Å thick according to a modification of the p-type semiconductor layer 32. Use of the first and the second adjusted thicknesses is preferred also in the n-type semiconductor layer which includes the additional semiconductor films.

Summarizing, the first total thickness should be either substantially equal to a quarter of the first wavelength or be substantially equal to the quarter minus or plus the first adjusting thickness. The second total thickness should either be substantially equal to a quarter of the second wavelength or be substantially equal to the quarter plus or minus the second adjusting thickness. In this manner, the first total thickness may be approximately equal to a quarter of the first wavelength. The second total thickness may be approximately equal to a quarter of the second wavelength.

Reviewing FIG. 4, it is possible to use first or the second semiconductor layer 11 or 12 in a semiconductor reflector or mirror. When selected, the n-type semiconductor layer 11 is grown on the n-type semiconductor substrate 14 with one of the wide band gap semiconductor films 22 left to have an exposed surface. After the semiconductor substrate 14 is polished to have a polished surface and a substrate thickness of about 100 microns, a pair of electrodes are formed on the exposed surface of the n-type semiconductor layer 11 and on the polished surface to provide a relector assembly. It is possible to understand that the electrodes are illustrated at 24 and 25. When a voltage is supplied between the electrodes, the reflector assembly serves as the semiconductor reflector having a high reflectivity for the nominal wavelength. It is possible to form a semiconductor reflector having a reflecting surface as wide as the whole wafer, namely, about 5 cm in diameter wide.

While this invention has thus far been described in specific conjunction with only two embodiments thereof and a few modifications, it will now be readily possible for one skilled in the art to carry this invention into effect in various other manners. For example, the semiconductor layer 11 or 12 may be used in a surface emitting laser diode of any one of other systems, such as a system of InP/InGaAsP. A combination of the active layer 13 and the lower and the upper adjacent and remote semiconductor films 16 to 19 may have a thickness which is substantially equal to an integral multiple of the full wavelength. The optical beam may not necessarily be coherent.

What is claimed is:

1. A semiconductor layer for reflecting an optical beam of a nominal wavelength, said semiconductor layer including a multilayer structure of a plurality of film pairs, said film pairs including alternately stacked narrow and wide band gap semiconductor films having a refractive index difference, the narrow band gap semiconductor film having a narrow band gap and the wide band gap semiconductor film having a wide band gap, wherein the improvement comprises a first intermediate semiconductor film between the narrow and the wide band gap semiconductor films of each of said film pairs, said first intermediate semiconductor film having a first intermediate band gap being varied between said narrow and said wide band gap, the narrow band gap semiconductor film of each of said film pairs and a portion adjacent thereto in said first intermediate semiconductor film serving as a first composite layer and having a first total thickness which is approximately equal to a quarter of a first wavelength of the optical beam in said first composite layer, the wide band gap semiconductor film of each of said film pairs and a remaining portion adjacent thereto in said first intermediate semiconductor film serving as a second composite layer and having a second total thickness which is approximately equal to a quarter of a second wavelength of the optical beam in said second composite layer.

2. A semiconductor layer as claimed in claim 1, wherein said first intermediate band gap is continuously graded so as to be equal to said narrow and said wide band gaps at first and second intermediate film surfaces of said first intermediate semiconductor film, the first intermediate film surface contacts the narrow band gap semiconductor film and the second intermediate film surface contacts the wide band gap semiconductor film.

3. A semiconductor layer as claimed in claim 2, wherein said first intermediate semiconductor film has a first intermediate film thickness which is substantially equal to a first barrier width of a first potential barrier, said narrow and said wide band gaps forming said first potential barrier of said first barrier width perpendicular to an interface between the narrow and the wide band gap semiconductor films of each of said film pairs if said intermediate semiconductor film were absent.

4. A semiconductor layer as claimed in claim 3, wherein said first total thickness is substantially equal to a quarter of said first wavelength, said second total thickness being substantially equal to a quarter of said second wavelength.

5. A semiconductor layer as claimed in claim 3, wherein said film pairs comprising first and second film pairs including the narrow band gap semiconductor film of said first film pair as a first band gap semiconductor film adjacent to a second band gap semiconductor film which is the wide band gap semiconductor film of said second film pair, further comprising a second intermediate semiconductor film between said first and said second band gap semiconductor films, said second semiconductor film having a second intermediate band gap being varied between said narrow and said wide band gaps, said first band gap semiconductor film and a portion adjacent thereto in said second intermediate semiconductor film having said first total thickness, said second band gap semiconductor film and a remaining portion adjacent thereto in said second intermediate semiconductor film having said second total thickness.

6. A semiconductor layer as claimed in claim 5, wherein said second intermediate band gap is continuously varied so as to be equal to said narrow and said wide band gaps at third and fourth film surfaces of said second intermediate semiconductor film.

7. A semiconductor layer as claimed in claim 6, wherein said second intermediate semiconductor film has a second intermediate film thickness which is substantially equal to a second barrier width of a second potential barrier, said narrow and said wide band gaps forming said second potential barrier of said second barrier width perpendicular to another interface between said first and said second band gap semiconductor films if said second intermediate semiconductor film were absent.

8. A semiconductor layer as claimed in claim 7, wherein said first band gap semiconductor film and the portion adjacent thereto in said second intermediate semiconductor film have a thickness which is substantially equal to a quarter of said first wavelength, said second band gap semiconductor film and the remaining portion adjacent thereto in said second intermediate semiconductor film having another thickness which is substantially equal to a quarter of said second wavelength.

9. A semiconductor layer as claimed in claim 7, said first barrier width being a sum of first and second portion widths which are present in said narrow and said wide band gap semiconductor films of each of said first and said second film pairs if said first and second intermediate semiconductor films were absent, wherein the narrow and the wide band gap semiconductor films of each of said first and said second film pairs have first and second adjusted thickness, said first adjusted thickness being substantially equal to said first total thickness minus twice said first portion width minus a first adjusting thickness when each of said narrow band gap semiconductor films more strongly absorbs said optical beam than each of said wide band gap semiconductor films, said first adjusted thickness being substantially equal to said first total thickness minus twice said first portion width plus a first adjusting thickness when each of said narrow band gap semiconductor films less strongly absorbs said optical beam than each of said wide band gap semiconductor films, said second adjusted thickness being substantially equal to said second total thickness minus twice said second portion width plus a second adjusting thickness when each of said narrow band gap semiconductor films less strongly absorbs said optical beam than each of said wide band gap semiconductor films, said second adjusted thickness being substantially equal to said second total thickness minus twice said second portion width minus said second adjusting thickness when each of said narrow band gap semiconductor films more strongly absorbs said optical beam than each of said wide band gap semiconductor films, said first and said second adjusting thicknesses, a first difference between said first total thickness and twice said first portion width, and a second difference between said second total thickness and twice said second portion width being determined according to an equation:

$$-n(1)d(1)/\left[n(1)D(1) + \int_0^{D(p)} n(x)dx\right]$$

$$= n(2)d(2)/\left[n(2)D(2) + \int_{D(p)}^{D(3)} n(x)dx\right],$$

wherein $n(1)$, $n(2)$, $n(x)$, $D(1)$, $D(2)$, $D(3)$, $D(p)$, $d(1)$, and $d(2)$ represent refractive indices of said narrow and said wide band gap semiconductor films, a varying refractive index of each of said first and second intermediate semiconductor films, said first and said second differences, each of said first and second intermediate film thicknesses, said first portion width, and said first and said second adjusting thicknesses, x representing a distance which is measured from each of said first intermediate film surface and said third film surface towards each of said second intermediate film surface and said fourth film surface in each of said first and said second film pairs.

10. A semiconductor layer as claimed in claim 3, said first barrier width being a sum of first and second portion widths which are present in said narrow and said wide band gap semiconductor films if said first intermediate semiconductor film were absent, wherein the narrow and the wide band gap semiconductor films of each of said film pairs have first and second adjusted thicknesses, said first adjusted thickness being substantially equal to said first total thickness minus said first portion width minus a first adjusting thickness when each of said narrow band gap semiconductor films more strongly absorbs said optical beam than each of said wide band gap semiconductor films, said first adjusted thickness being substantially equal to said first total thickness minus said first portion width plus said first adjusting thickness when each of said narrow band gap semiconductor films less strongly absorbs said optical beam than each of said wide band gap semiconductor films, said second adjusted thickness being substantially equal to said second total thickness minus said second portion width plus a second adjusting thickness when each of said narrow band gap semiconductor films less strongly absorbs said optical beam than each of said wide band gap semiconductor films, said second adjusted thickness being substantially equal to said second total adjusting thickness minus said second portion width minus said second adjusting thickness when each of said narrow band gap semiconductor films more strongly absorbs said optical beam than each of said wide band gap semiconductor films, said first and said second adjusting thicknesses, a first difference between said first total thickness and said first portion width, and a second difference between said second total thickness and said second portion width being determined according to an equation:

$$-n(1)d(1)/\left[n(1)D(1) + \int_0^{D(p)} n(x)dx\right] \quad (2)$$

-continued $$= n(2)d(2) / \left[ n(2)D(2) + \int_{D(p)}^{D(3)} n(x)dx \right],$$

where n(1), n(2), n(x), D(1), D(2), D(3), D(p), d(1) and d(2) represent refractive indices of said narrow and said wide band gap semiconductor films, a varying refractive index of said first intermediate semiconductor film, said first and said second differences, said first intermediate film thickness, said first portion width, and said first and said second adjusting thicknesses, x representing a distance which is measured from said first intermediate film surface towards said second intermediate film surface.

* * * * *